United States Patent
Anand et al.

(10) Patent No.: US 7,089,136 B2
(45) Date of Patent: Aug. 8, 2006

(54) METHOD FOR REDUCED ELECTRICAL FUSING TIME

(75) Inventors: Darren L. Anand, Essex Junction, VT (US); John E. Barth, Jr., Williston, VT (US); Steven F. Oakland, Colchester, VT (US); Michael R. Ouellette, Westford, VT (US)

(73) Assignee: International Business Machines Corporation, Armonk, NY (US)

( * ) Notice: Subject to any disclaimer, the term of this patent is extended or adjusted under 35 U.S.C. 154(b) by 152 days.

(21) Appl. No.: 10/604,414

(22) Filed: Jul. 18, 2003

(65) Prior Publication Data

US 2005/0013187 A1    Jan. 20, 2005

(51) Int. Cl.
    *G01R 31/00* (2006.01)
(52) U.S. Cl. .................. 702/117; 714/726
(58) Field of Classification Search ............ 702/58–59, 702/81–82, 109–110, 117–118, 182–183, 702/120, 185; 714/726–727, 729, 733, 742, 714/30; 340/638–639; 365/225.7, 96, 189.12, 365/201, 221, 189.02, 230.02–230.08
See application file for complete search history.

(56) References Cited

U.S. PATENT DOCUMENTS

| 3,783,254 | A | | 1/1974 | Eichelberger ............. 235/152 |
| 6,008,523 | A | | 12/1999 | Narayan et al. ............ 257/529 |
| 6,292,422 | B1 | * | 9/2001 | Pitts ....................... 365/225.7 |
| 6,388,929 | B1 | * | 5/2002 | Shimano et al. .......... 365/201 |
| 6,567,323 | B1 | * | 5/2003 | Pitts et al. ................ 365/200 |
| 6,662,133 | B1 | * | 12/2003 | Engel et al. ............... 702/117 |
| 6,757,204 | B1 | * | 6/2004 | Di Ronza et al. ......... 365/200 |
| 2002/0051400 | A1 | * | 5/2002 | Yoneya et al. .......... 365/225.7 |
| 2004/0136257 | A1 | * | 7/2004 | Nelson et al. ........... 365/225.7 |
| 2005/0018517 | A1 | * | 1/2005 | Collura et al. ........... 365/225.7 |

OTHER PUBLICATIONS

Ouellette et al., "Shared fuse macro for multiple embedded memory with redundancy", May 2001, Custom Integrated Circuits, pp. 191-194.*
Cowan et al., "On-chip repair and an ATE independent fusing methodology", Oct. 2002, Test Conference, pp. 178-186.*

* cited by examiner

*Primary Examiner*—Marc S. Hoff
*Assistant Examiner*—Mary Catherine Baran
(74) *Attorney, Agent, or Firm*—Richard A. Henkler; Dillon & Yudell LLP

(57) ABSTRACT

An electrical fuse circuit design for reducing the testing time for a semiconductor device manufactured with redundant eFuse circuitry. A two-to-one multiplexer (MUX) is provided at each eFuse circuit in addition to the fuse latch and pattern latch. Information on which fuse is to be blown is stored in the fuse's pattern latch. The output of the pattern latch is ANDed with a program input to provide a select signal for the MUX. Based on the select signal, the MUX allows the shifted "1" to either go to the next latch in the shift chain or bypass the next latch or latches in the shift chain when the next fuse(s) is not to be blown. Accordingly, the invention enables only those fuse latches associated with fuses that are to be blown to hold up the propagation of the shifted "1" to the next eFuse circuits.

17 Claims, 4 Drawing Sheets

METHOD FOR REDUCED ELECTRICAL FUSING TIME

BACKGROUND OF INVENTION

1. Technical Field

The present invention relates generally to semiconductor devices and in particular to electrical programming of on-chip fuses of semi-conductor devices. Still more particularly the present invention relates to reducing fusing time during electrical programming of on-chip fuses of semiconductor devices.

2. Description of the Related Art

Current semiconductors and other similar devices are often manufactured with a large number of fuse elements which are used to invoke the replacement of failing cells or components, and provide DAC trimming, etc. During testing of the device, selected fuses are usually blown by either a laser beam or an electrical current, depending on the design of the fuse/device. In an electrical fuse design, electronically programmable fuses are blown by passing a current through the fuse link. The electrical current then causes a permanent change to the resistance of the fuse. The fuses that are blown are selected via one or more programming methods, which are generally known to those skilled in the art.

FIG. 1 illustrates a prior art schematic of a portion of a device with fuse elements (eFuse circuits) and input signals/logic. Only two fuses are illustrated, although a complete device may comprise a much larger number of fuses. As shown, the electrical fuse circuits are fabricated with two latches per fuse. The first latch, which is called the fuse sense latch (or fuse latch) 103 is utilized to read the state of the fuse and is also utilized during the fusing process to enable/disable the blowing of the associated fuse. The second latch, called the pattern latch 113, is utilized to store the redundancy solution that was calculated for the device. According to FIG. 1, the fuse latch 103 is in the "upper" register and the pattern latch 113 is in the "lower" register.

As illustrated, the two chains of latches (fuse latches 103 and pattern latches 113) are connected in serial fashion, with each latch receiving it's shift input from the previous latch and sending it's shift output to the next latch in the chain. With this topology, enabling an electrical fuse to be programmed requires that both the output of the fuse latch 103 and pattern latch 113 corresponding to a specific fuse be set high (utilizing and AND logic function 105). Prior to fuse programming, the FSOURCE input 109 is set to a voltage high enough to program the fuses. Other inputs, including clock inputs ACLK 110 and BCLK 111, for example, along with input logic 116–119 are utilized to set the values within the latches. During the time that both latches are set high and global input GATEN is high, the programming transistor 107 for the eFuse turns on, blowing the connected fuse 106.

A major cost adder to the production of semiconductor devices (such as ASIC—application-specific integrated circuit—logic chips) is the time and financial costs incurred when testing the device. A major portion of the testing and associated costs involves the fusing process (i.e., the process by which the fuses are selected and electrically blown). Current electrical fusing times are on the order of 200 µs per fuse. Due to the fusing current and on chip routing of relatively high voltage and high current busses, fusing multiple fuses at a time is not a practical solution for typical semiconductor devices. With fusing current as high as 15 mA per fuse, multiple simultaneous fuse blow becomes difficult and requires more device I/O's to be dedicated to the fuse blow input (called FSOURCE) supply. Using many input pads on a chip/package to support electrical fusing is not a cost effective solution. Thus, fuses are currently blown in a serial manner (i.e., one at a time) during testing because of the high fusing current and other factors describe. With electrical fuses it is desirable to reduce fusing time as much as possible.

The fusing process can require a significant amount of time compared to the overall testing time. This is mainly due to the microsecond time scale used in fusing versus the nanosecond timings used for test. The fusing time is controlled by the rate at which a single '1' is clocked or shifted through the fuse latches 103. Only one fuse latch 103 is set high at a time, guaranteeing only one fuse 106 is "blown" at a time. With this design, fusing time required for one fuse is spent on every latch in the fuse latch shift chain.

For example, assume the fusing process takes 1 clock cycle to blow each fuse. Then, the number of total clock cycles required for completing the test when the fuses are serially blown equals at least the number of fuses in the device. With the large number of fuses in current devices, typically hundreds or thousands, this serial implementation requires significant time commitment and is extremely inefficient for devices that only require a small percentage of the available fuses to be blown.

Another primary concern with current designs is the area overhead incurred due to the need to individually address electrical fuses on-chip. U.S. Pat. No. 6,426,911 provides one solution that addresses this area overhead problem by creating a shift register by a serial in/serial out wiring of the fuse latches and the connection of the gates of the blow transistors to the serial out port of each fuse latch. However, the problem of fuse time remains as the technique provided by the patent fails to reduce the one-by-one propagation of the signal through each latch of the fuse scan chain. That is, the programming information is propagated from latch to latch as a single "1" acting as a pointer that activates only one fuse latch per clock cycle. Also, only one fuse is blown per clock cycle to prevent the problems associated with high electrical current and other overhead issues described above.

From the perspective of a scan path, particular types of latches are provided to enable a scan chain evaluation for the device. In FIG. 1, the fuse scan chain connections are illustrated with LSSD (level sensitive scan design) latches. The fuse latches 103 and pattern latches 113 are serially connected and wired into the fuse logic. The fuse pattern is loaded into the lower or pattern register prior to programming. The upper or fuse register has a single bit ("1") loaded and "walked" down the shift register. The clock frequency utilized to clock the fuse register gives simple control over the fuse programming time.

As illustrated by FIG. 1, each serial register of latches (LSSD scan latches) comprises a dual latch. The first latch in an LSSD scan latch is called the L1 and is loaded with clock signal ACLK 110. The second latch in the LSSD scan latch is called the L2 and is loaded with signal BCLK 111. When the fuse 107 is sensed, the value is sensed into the latch L1. Sensing of the fuse is done with a single ended resistor divider technique that is generally known to those skilled in the art. If the fuse 107 is intact, the latch will be pulled low by the connection from the fuse to FSOURCE 109, which must be at 0 Volts (GND) during sensing of the fuse. If the fuse 107 is programmed (blown), the latch L1 will remain high. Once the signal that enables fuse sense goes low, the fuse latch sensing is complete.

The present invention recognizes the inefficiencies that exist in the design and testing of current devices and recognizes that it would be desirable to reduce the time and costs associated with the fusing process, particularly when only a small fraction of the total number of fuses are actually being blown. A method and device that enables efficient completion of the fuse blowing stage of device testing would be a welcomed improvement. It would be further desirable if the method and device also enabled reduced area overhead along with the reduced fusing time. These and other benefits are provided by the invention described below.

SUMMARY OF INVENTION

Disclosed is a method and electrical fuse circuit design for reducing the testing time for a semiconductor device which uses fuse circuitry. A two-to-one multiplexer (MUX) is provided at each fuse circuit in addition to the fuse latch and pattern latch associated with the fuse circuit. Information on which fuse is to be blown is stored in the fuse's pattern latch. Utilizing the output generated by the pattern latch, the MUX then allows the shifted "1" to either go only to the current latch in the shift chain (program state) or go to the current latch and the next latch in the shift chain (bypass state). Any number of MUXes in a row could be in the bypass state causing the walking "1" to follow the bypass paths of the MUXes until it reaches a latch and MUX in the program state. Since the AND logic to program a fuse requires the fuse and pattern latch be set, only the latch that is in the program state will program the fuse. The fuse latches in the bypass state also load a "1" but since their corresponding pattern latches are not set, the AND logic will not program the associated fuses. Accordingly, rather than serially shifting through each fuse latch within the device one at a time, the invention enables the shifted "1" to go directly to the next fuse to be programmed.

According to one embodiment, a '1' is utilized in the pattern latch to specify that a fuse is to be blown and a "0" specifies that a fuse is not to be blown. The complement output of the pattern latch is ANDed with a control signal to select the MUX state from among an upper (latch) input and a lower (MUX bypass) input. The control signal is asserted to a high state during fuse blow. If the pattern latch output indicates the fuse is to be blown, the high (1) input of the MUX is selected and the shift path is routed through the fuse latch. When the pattern latch output indicates the fuse is not to be blown, the low (0) input of the MUX is selected, which in effect results in a bypass of the latch. This latter operation bypasses the fuse latch and sends the walking "1" downstream to the next latch of the sequence of latches (or eFuse circuits) at which the pattern latch indicates the fuse is to be blown.

Since only a small percentage of the total number of fuses is to be blown during testing (e.g., 10 percent of the total number of fuses), a substantial time-savings is provided (i.e., almost 10×improvement for the example) by the invention with minimal circuit overhead. When serial readout of the fuse latches is required, the control signal is held low. This forces all the MUXes to select the high input and also forces all of the fuse latches to be in the shift pat regardless of the state of the pattern latches. This forced non-bypass state can also be used for testing the fuse latches where each latch needs to be in the shift path. Implementation of the invention thus reduces processing time for traditional eFuse circuit devices and testing procedures thereof.

The above as well as additional objectives, features, and advantages of the present invention will become apparent in the following detailed written description.

BRIEF DESCRIPTION OF DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION

The present invention provides a novel method and device design for reducing electrical fusing times in semiconductor devices during testing. The invention comprises a circuit design and methodology for completing more efficient testing of electrical fuses within a semiconductor device by selectively walking the blow signal to only those fuses that are to be blown.

Figure 1:
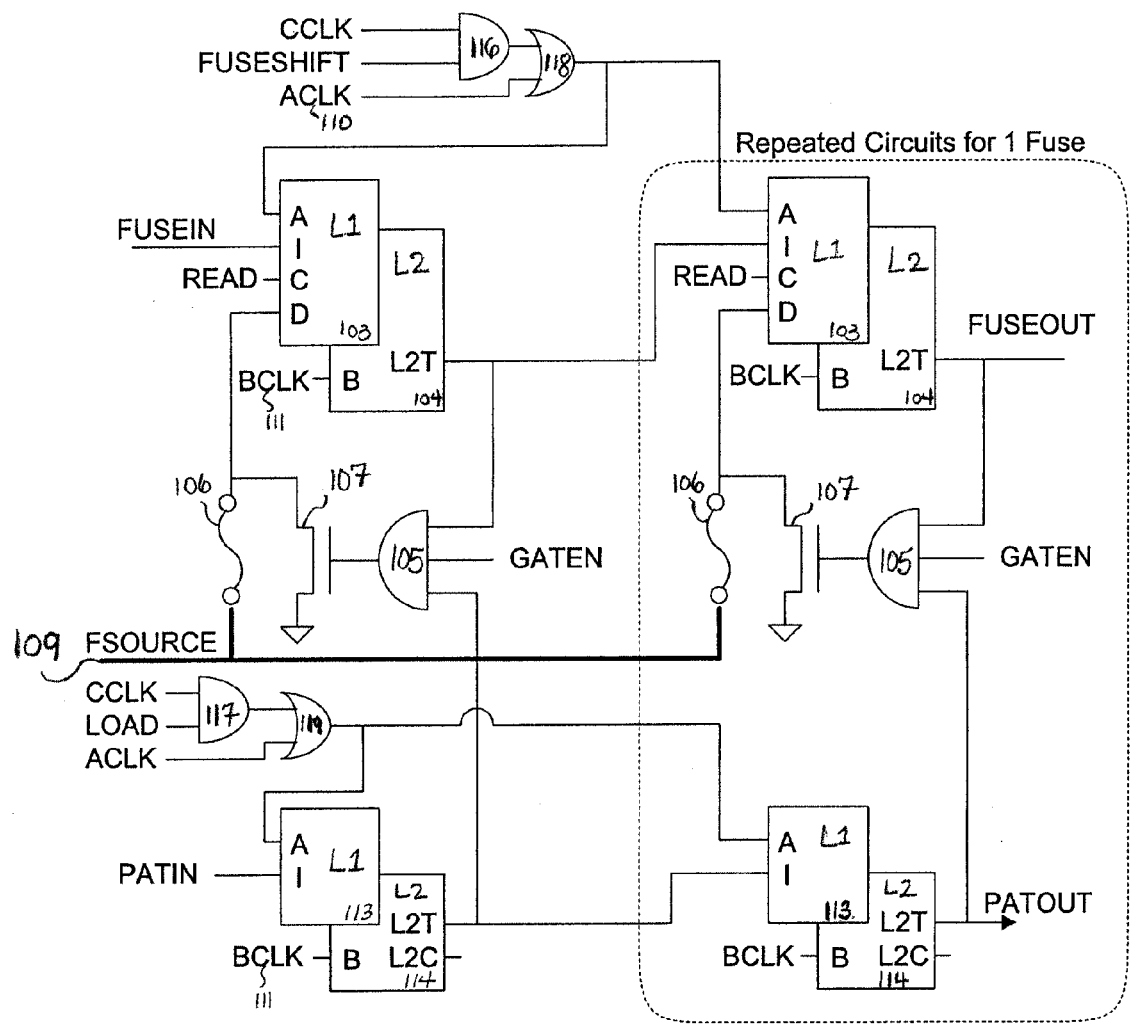
FIG. 1 is a schematic diagram of a prior art fuse latch circuit that is tested utilizing prior art methods with long testing times.
Figure 2:
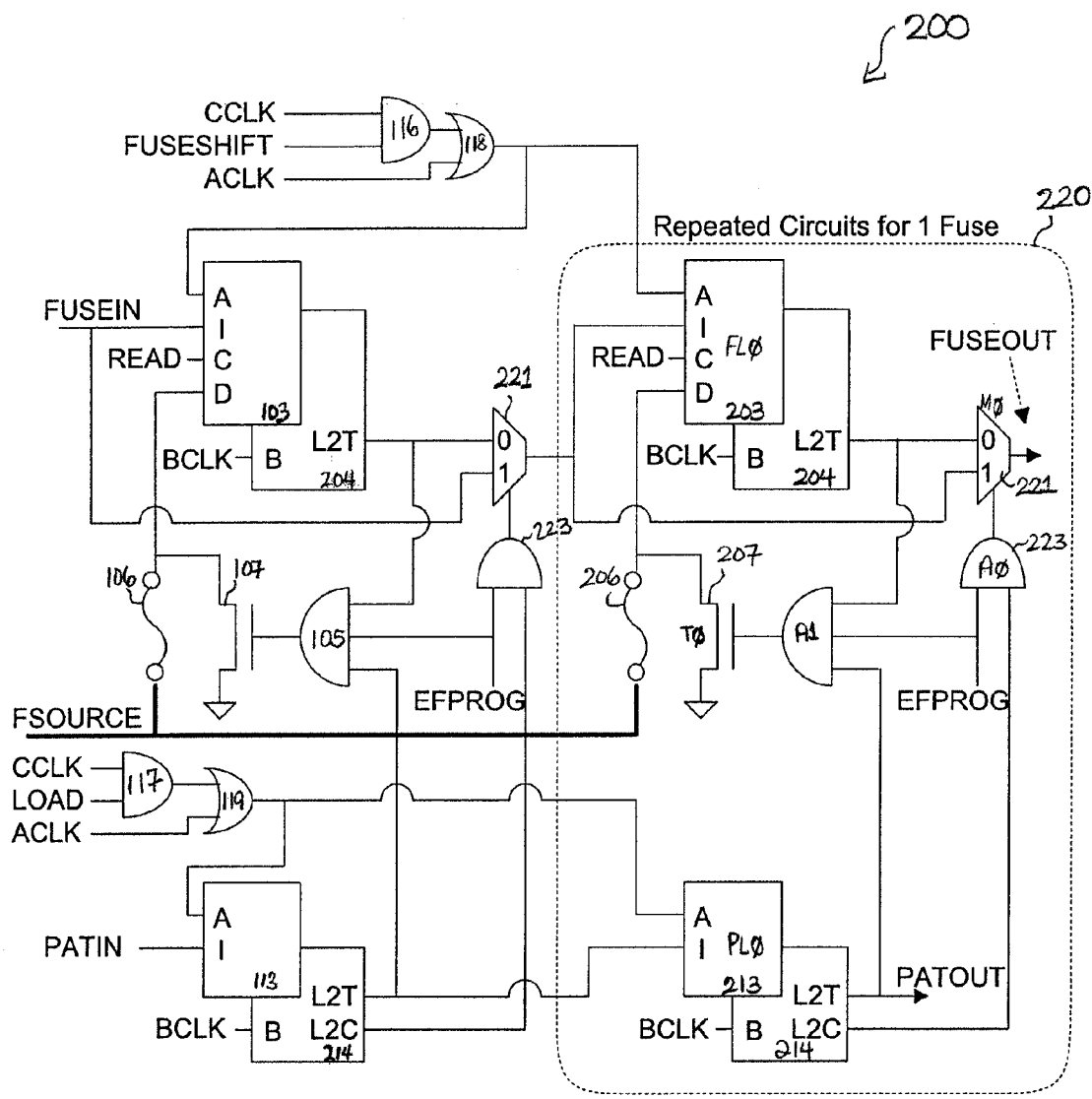
FIG. 2 is a schematic diagram of a fuse-latch circuit that selectively programs electrical fuses via a latch bypass mechanism to provide timing benefits when testing the device according to once embodiment of the present invention.

Referring now to FIG. 2, there is illustrated a schematic circuit diagram of a semiconductor device (eFuse circuits) designed to implement selective fusing operations according to the methods of the present invention. Specifically, FIG. 2 shows the new fuse latch circuitry to enable the novel selective fuse blowing and bypass features. Device 200 comprises many of the similar logic and other components of FIG. 1, including serially connected fuse circuits (see box labeled "Repeated Circuits for 1 Fuse"). Consequently, like numerals are utilized for the signal inputs and logic and portions of the initial fuse circuit connected thereto. Corresponding numbers are utilized to differentiate the components (both old and new) of the repeated circuits to indicate that even though similar fuse and latch circuitry are being utilized, these components are connected to additional components and provide a different overall functionality than similar components in FIG. 1. In FIG. 2, two additions are made to the eFuse circuits from previous designs. First, a MUX is added to facilitate "skipping" fuse blow time (or "bypassing" fuse latches) on fuses that are not to be blown. Second, AND gate (or logic) is provided to enable correct selection of one of the inputs to the MUX.

Each fuse circuit 220 comprises a fuse 206, which may be blown when current signals are provided to a source and gate of transistor 207. Each eFuse circuit 220 further comprises fuse sense latch or fuse latch (FL0) 203, utilized to read the state of the fuse and during the fusing process to enable the fuse that is currently being blown. Also, each eFuse circuit 220 comprises pattern latch (PL0) 213, utilized to store the fuse solution previously calculated and programmed for the device.

As mentioned above, in addition to these components, eFuse circuit 220 comprises a two-to-one" multiplexer (MUX) 221 (also labeled M0 to indicate the first of the series of MUXes, M0 to MN, where N is an integer) and an AND logic 225 (also labeled A0 to indicate a first in a series, A0 to AN), whose output serves as the select signal for MUX 221. MUX 221 is utilized to allow the shifted '1' or walking '1' to either go to the next fuse latch in the shift chain or bypass (from a timing perspective) the next fuse latch (or latches) in the shift chain depending on whether the corresponding fuse is to be blown. The first (or upper) MUX input is coupled to the true output (L2T) of the previous fuse latch 203 and is a low (0) input. The second (or lower) MUX input is coupled to the previous MUX 221 in the series of eFUSE circuits and is a high (1) input.

Notably, although the illustrative embodiments assigns the upper input of MUX 221 to the true output of the fuse latch (L2T) and the lower input of MUX 221 to the component output of the pattern latch (L2C), the invention may likewise be implemented with the inputs assigned in the reverse manner. That is, a reverse configuration of MUX inputs may be implemented, but with some additional change to the AND logic and/or the pattern latch. With a reversed-input MUX configuration, the AND logic is replaced by a NAND gate and/or the output from AND logic is passed through an inverter. Other implementations are possible and all fall within the teachings of the present invention.

FIG. 2 also illustrates possible inputs (signals and logic) to the device. Input circuitry and signals 210 provide the inputs required from powering and running/operating the eFuse circuits 220. Input circuitry and signals 210 include multiple clock signals, ACLK, BCLK, CCLK, gating logic, and a power source FSOURCE. Specific implementation of the input circuitry and signals are not particularly important for the invention and conventional means may be utilized. However, in one embodiment of the invention, a specific configuration of input signals are provided for additional functionality, and this configuration of input signals is described within co-pending U.S. patent application, Ser. No. 10/604,908 entitled "Method for Splitting Shift and Scan Paths on Scan Only LSSD Latches" and filed on Aug. 26, 2003. The relevant content of that application is hereby incorporated by reference.

The information on whether a fuse is to be blown is programmed and stored in pattern latch 213, which is local to each eFuse circuit 220. According to the invention, pattern latch 213 provides an output that indicates when the associated fuse is to be blown and sends that output to MUX 221. For the illustrative embodiment, pattern latch 213 is programmed with a '1' when the associated fuse 206 is to be blown, and pattern latch 213 is programmed with a '0' when the fuse 206 is not to be blown.

In the illustrative embodiment, the complement output (i.e., the output of port L2C) of PL0 213 is utilized as one input to AND logic 225. AND logic 225 also receives a program input, EFUSEPROGRAM (EFP) 223, and both EFP 223 and the complement of the value stored/programmed in PL0 213 are ANDed together to select one of the two inputs to MUX 221. The upper input of MUX 221 is the input corresponding to the serial flow of the shifted "1" through the fuse latches (i.e., L2T) that in certain circumstances results in the fuse 206 being blown. The lower input, however, operates as a bypass trigger for the eFuse circuit so that the fuse latch is not triggered to initiate programming of the fuse. Rather, the shifted 1 is passed on to a next sequential MUX of a next sequential eFuse circuit and so on. This process is also illustrated by the flow chart of FIG. 4B, which is now described.

Figure 4:
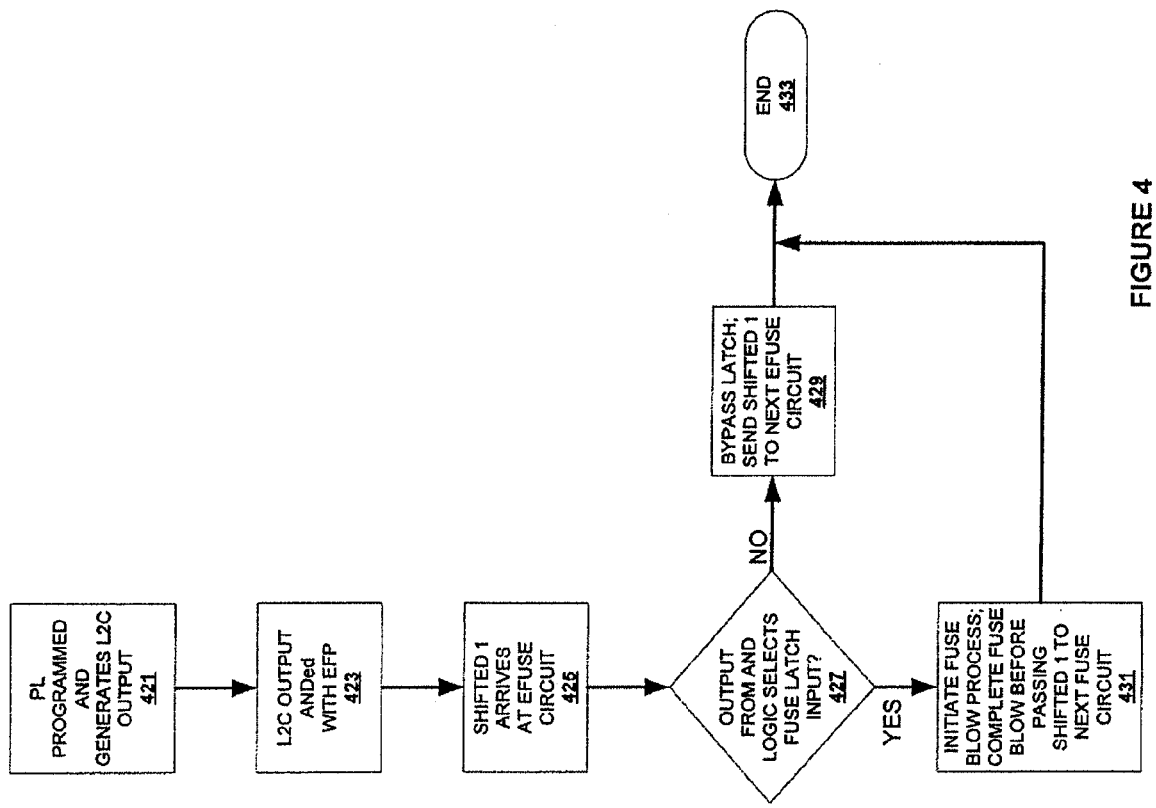
FIG. 4 is a basic flow diagram illustrating the process by which only fuses to be blown are selected during a walk-through of a device designed according to one embodiment of the invention.

FIG. 4 provides a general summary of the processes completed by eFuse circuits 200 in completing a test procedure that involves a blowing of some fuses within a device and bypassing of other fuses. Beginning at block 421, the pattern latch is first programmed by any one of the known methods for programming the pattern latch, and the pattern latch provides a complement output (L2C). The L2C output is ANDed with the EFP input as shown at block 423. A shifted 1 arrives at the eFuse circuit as indicated at block 425, and a determination made at block 427 whether the MUX select signal from the AND logic selects the fuse latch input (over the MUX bypass input).

If the MUX selects the fuse latch input, a fuse blow process is indicated for the eFuse circuit as shown at block 431, and fuse blow process is completed before the shifted 1 is passed to the next eFuse circuit. However, when the MUX does not select the fuse latch input, the MUX bypass input is selected and the shifted 1 is sent to the next eFuse circuit as shown at block 429. The processing at the current eFuse circuit then ends, as shown at block 433.

Figures 3A, 3B:
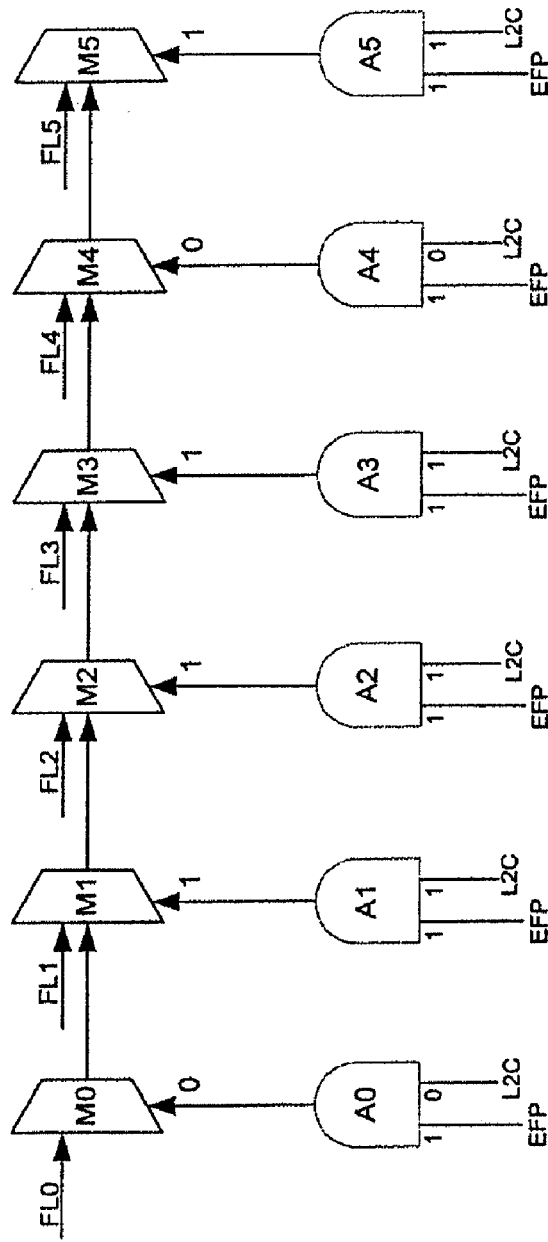
FIG. 3A is a logical diagram of a series of multiplexers (MUX) with their input and select signals within an eFuse circuit device according to one embodiment of the present invention.
FIG. 3B is a table illustrating the time difference in clock cycle between a traditional fuse latch shift process and the bypass process implemented by the MUXes of FIG. 3A according to one embodiment of the invention.

FIG. 3A provides a close-up view of six serially-connected MUXes (M0 through M5) and their inputs and select signals according to one embodiment. As shown, M0 and M4 are both triggered to select their upper inputs from the preceding fuse latch. The triggering is completed by the AND logics and based on the L2C outputs from the corresponding pattern latches, respectively.

With reference again to FIG. 2 and FIG. 3, where appropriate, EFP 223 is asserted to a high state during fuse blow. If the L2C output of latch PL0 213 is low (i.e., the pattern latch L2 is high and the fuse is to be blown), then the upper input of MUX 223 coupled to the fuse latch (i.e., the input that indicates the fuse latch is to initiate the fuse blow process that ultimately blows the fuse 206) is selected, and the shift path is routed through latch FL0. This means the "walking 1" that enables fuse blow in the fuse latch chain is sent through latch FL0 to initiate a fuse blow. Consequently, when EFP 223 is '1' and L2T from PL0 is '1' and L2T from FL0 is '1', the programming transistor (T0) 207 turns on, blowing the fuse 206.

If the PL0 latch 213 is set low, the corresponding L2C output is high and the MUX 221 chooses its lower input corresponding to the bypass input that is received from the previous MUX. The FL0 is bypassed (i.e., time to switch through latches, etc. does not hold up the propagation of the walking "1" to the next eFuse circuit) and the walking '1' is sent downstream to the latches where the L2C output from the pattern latch is high. All fuse latches that have a corresponding pattern latch set low (L2C="1") still load the walking "1" but the fuse does not blow due to the pattern latch L2T output that goes to the AND logic. Since L2T is low for a fuse that is not to be blown, the programming device (A1) cannot turn on. Accordingly, the MUX logic allows the number of "walking 1" shift cycles to equal the number of fuses to be blown from a timing perspective.

FIG. 3B is a table showing the response of the MUX logic of FIG. 3A to the select inputs of the AND logic and the clock time required for passing the shifted 1 through the sequence of eFuse circuits. The MUXes are indicated in each column and the parameter being tabulated and shown in their respective rows, each entry now corresponding to the particular MUX. For illustrative purposes, it is assumed that a single clock cycle is required to complete a fuse blow operation at any one of the eFuse circuits at which the blow operation is completed. A bypass of the fuse blow operation is assumed to be almost negligible in terms of time (i.e., 1/100 of the time for the fuse blow). For a fuse with MUXes in bypass preceding, the fusing time for that fuse will be reduced by the propagation delay of the MUXes. This however is negligible since the MUX delays are less then ¼ nanosecond each and the fusing time is 200 microseconds.

The pre-programmed pattern latch outputs are illustrated in the first row with a 1 indicating that the fuse is to be blown and a zero indicating the fuse should not be blown (i.e., bypassed). Pattern logic of eFuse circuits 1 and 4 are programmed to blow their fuses. Accordingly, the second row indicates which logic component is triggered/selected by the MUX during the serial shifting of the shifted 1 through the eFuse circuits. Again fuse latch input is selected for both eFuse circuits 1 and 4, while the MUX (bypass) input is selected for all other eFuse circuits.

With respect to the time (clock cycles) required to complete each operation at each circuit, row 3 provides the 1 to 1 ratio of clock cycles to number of circuits as required by the prior art methods. Row 4 provides the clock cycles based on the novel methodology and circuit design of the invention. As can be seen, only the fuse blow process of circuits 1 and 4 utilizes the full clock cycle to complete blow operation at those eFuse circuits. The other circuits are bypassed and do not require a time of processing the full clock cycle before proceeding to the next circuit as in the prior art.

During serial readout of the fuse latches (i.e., where all the fuse latches are required to be in the shift path), EFUSEPROGRAM is held low, forcing all MUXes 221 to choose the upper input (from the fuse latches). This also forces all fuse latches to be in the shift path regardless of the state of the pattern latches. The pattern latch register thus controls the "effective length" of the fuse latch register to equal the number of '1's onset latches in the pattern register only when EFUSEPROGRAM is high.

One advantage of the method implemented by the invention is that "one at a time" fusing is maintained, requiring only one FSOURCE input signal for many eFuse circuits. However, rather than spending 200 μs at every eFuse circuit location (as with prior art), the invention enables the 200 μs be spent only on those fuses that are to be blown. Thus, for example, if only 10 percent of the fuses are to be blown, a blow operation completed during testing of a device designed according to the invention achieves a 10× improvement in fusing time over the previous serial methods. More importantly, this 10× improvement comes without additional power requirement and with very little circuit overhead. The fusing design is a time-efficient blowing method that substantially reduces by several magnitudes the testing time for the device.

While the invention has been particularly shown and described with reference to a preferred embodiment, it will be understood by those skilled in the art that various changes in form and detail may be made therein without departing from the spirit and scope of the invention.

The invention claimed is:

1. A circuit for programming and testing electrical fuse (eFuse) circuits in a device, said circuit comprising:

an eFuse circuit that includes a fuse, a blow device, and a control input for said blow device;

first logic means for determining when to blow said fuse, wherein said first logic means comprises:

a first latch component having multiple inputs and which provides a true output;

a second latch component having multiple inputs and which provides both a second true output and a complement output;

wherein said second latch component is programmed with a blow value for said fuse such that the blow value dictates when a fuse is to be blown; and an EFUSEPROGRAM signal that together with said true output and said second true output provides the control input to said blow device;

second logic means for triggering a bypass of a pre-blow process within said eFuse circuit when said fuse is not to be blown, wherein a shifted 1 propagating through a plurality of eFuse circuits within said device is passed to a next downstream eFuse circuit without delay attributable to said pre-blow process; wherein said second logic means comprises:

an AND gate having a first input coupled to said complement output of said second latch, a second input coupled to said program signal, and a result output;

a multiplexer (MUX) having a first MUX input coupled to the true output of said first latch component, a second MUX input coupled to a selected output of a previous MUX of a third eFuse circuit sequentially before said eFuse circuit, a select input coupled to said result output of said AND gate, and a select output; and third logic means for maintaining the EFUSEPROGRAM signal in a logic low state during serial readout of fuse latches within a shift path, such that the MUX is forced to choose the input from a fuse latch of the circuit and the fuse latch is forced to be within the shift path regardless of the state of the pattern latch.

2. The circuit of claim 1, wherein further:

said first MUX input is selected when said result output is low (0);

said second MUX input is selected when said result output is high (1); and said blow device is triggered to blow said fuse when said first MUX input is selected and both said true output and said second true output are high.

3. The circuit of claim 1, wherein the pattern latch register controls an "effective length" of the fuse latch register to equal a number of logic high states (1) onset latches in the pattern register only when EFUSEPROGRAM is at a logic high state.

4. The circuit of claim 1, wherein a fuse blow process is indicated for an eFuse circuit if the MUX selects the fuse latch input, and the fuse blow process is completed before the shifted 1 is passed to the next eFuse circuit.

5. The circuit of claim 1, wherein when the MUX does not select the fuse latch input, the MUX bypass input is selected and the shifted 1 is sent to the next eFuse circuit.

6. In a device that includes multiple, serially connected, electrical fuse (eFuse) circuits, a system for programming and testing eFuse circuits, said system comprising:

an AND gate having two inputs and a result output;

a multiplexer (MUX) having a first input, a second input, a select input, and a MUX output, wherein select input is coupled to said result output of said AND) gate;

wherein, said eFuse circuit includes a fuse coupled to a switch that is controlled by signals from a fuse latch, a pattern latch, and a program signal source, said pattern latch being programmed with a fuse blow status indicating whether or not said fuse is to be blown during device testing;

first logic means for determining when to blow said fuse, wherein said first logic means comprises an EFUSEPROGRAM signal that together with said true output and said second true output provides the control input to said blow device;

second logic means for enabling a bypass of a pre-blow process within said eFuse circuit when said fuse blow status indicates that said fuse is not to be blown, such that a time delay associated with said fuse-blow process is substantially eliminated as a testing operation proceeds to each eFuse circuit within said device; and third logic means for maintaining the EFUSEPROGRAM signal in a logic low state during serial readout of fuse latches within a shift path, such that the MUX is forced to choose the input from a fuse latch of the circuit and the fuse latch is forced to be within the shift path regardless of the state of the pattern latch.

7. The system of claim 6, wherein said second logic means for enabling the bypass includes connecting components and signals of said eFuse circuit to said MUX and said gate, wherein said MUX and said AND gate provide a bypass function that determines when a shifted "1" that is being serially propagated to each of said eFuse circuits should be forwarded to said fuse latch for initiating a blow of said fuse, wherein when a fuse blow status within said pattern latch indicates that said fuse is not to be blown, said MUX forwards said shifted 1 to a next eFuse circuit without waiting on a completion of said pre-blow process.

8. The system of claim 7, wherein said second input of said MUX is coupled to a "fuse in" signal when said MUX is a first MUX in said serially connected eFuse circuits.

9. The circuit of claim 6, wherein:
a first input of said AND gate is coupled to a complement of a signal from said pattern latch indicating the fuse blow status;
a second input of said AND logic is coupled to said program signal source;
said first input of said MUX is coupled to said fuse latch; and
said second input of said MUX is coupled to a MUX output of a previous MUX.

10. The system of claim 9, wherein further said MUX output of said MUX is connected to a second input of a next MUX of a next eFuse circuit.

11. The system of claim 6, wherein, said eFuse circuit is a first eFuse circuit that is serially connected to a second eFuse circuit, whose fuse blow status indicates its fuse should not be blown, and a third eFuse circuit whose fuse blow status indicates its fuse should be blown, said circuit comprising:
means for first muting said shifted 1 through said fuse latch of said first eFuse circuit, subsequently bypassing a fuse latch of said second eFuse circuit, and then routing said shifted 1 through a fuse latch of said third eFuse circuit, wherein only said first eFuse circuit and said third eFuse circuit utilizes processing time for routing said shifted 1 through respective fuse latches before forwarding said shifted 1 to a next eFuse circuit.

12. The system of claim 6, wherein the pattern latch register controls an "effective length" of the fuse latch register to equal a number of logic high states (1) onset latches in the pattern register only when EFUSEPROGRAM is at a logic high state.

13. The system of claim 6, wherein a fine blow process is indicated for an eFuse circuit if the MUX selects the fuse latch input, and the fuse blow process is completed before the shifted 1 is passed to the next eFuse circuit.

14. The system of claim 6, wherein when the MUX does not select the fuse latch input, the MUX bypass input is selected and the shifted 1 is sent to the next eFuse circuit.

15. In a device that includes multiple, serially connected eFuse circuits, each having a fuse, a fuse switch, a fuse latch, a pattern latch, a fuse program signal, AND logic and a bypass multiplexer (MUX), a method for reducing programming and testing time for said device comprising:
storing a fuse blow status within said pattern latch;
ANDing a complement of said fuse blow stats with said fuse program signal;
selecting one of two inputs of said MUX based on a result of said ANDing step, said inputs including a first input coupled to a true output of said fuse latch and a second input coupled to a MUX output of a previous eFuse circuit;
forwarding a shifted 1 propagating through said device to a next eFuse circuit without waiting for a pre-blow processing time to elapse when said second input is selected, wherein a time delay for propagating said shifted 1 through said eFuse circuit is substantially eliminated;
determining when to blow said fuse, wherein said first logic means comprises an EFUSEPROGRAM signal that together with said true output and said second true output provides the control input to said blow device; and
maintaining the EFUSEPROGRAM signal in a logic low state durring serial readout of fuse latches within a shift path, such that the MUX is forced to choose the input from a fuse latch of the circuit and the fuse latch is forced to be within the shift path regardless of the state of the pattern latch.

16. The method of claim 15, further comprising controlling, via the pattern latch register, an "effective length" of the fuse latch register to equal a number of logic high states (1) onset latches in the pattern register only when EFUSEPROGRAM is at a logic high state.

17. The method of claim 15, further comprising:
indicating a fuse blow process for an eFuse circuit if the MUX selects the fuse latch input, and completing the fuse blow process before the shifted 1 is passed to the next eFuse circuit; and
selecting the MUX bypass input and forwarding the shifted 1 to the next eFuse circuit when the MUX does not select the fuse latch input.

* * * * *